United States Patent [19]

Black et al.

[11] Patent Number: 4,744,008
[45] Date of Patent: May 10, 1988

[54] FLEXIBLE FILM CHIP CARRIER WITH DECOUPLING CAPACITORS

[75] Inventors: Vincent J. Black, Apalachin; Ronald S. Charsky, Binghamton; Leonard T. Olson, Endwell, all of N.Y.

[73] Assignee: International Business Machines Corporation, Armonk, N.Y.

[21] Appl. No.: 97,322

[22] Filed: Sep. 11, 1987

Related U.S. Application Data

[63] Continuation of Ser. No. 931,813, Nov. 18, 1986, abandoned.

[51] Int. Cl.⁴ .............................................. H05K 7/20
[52] U.S. Cl. .................................... 361/386; 361/321; 361/398; 361/401; 357/75
[58] Field of Search ............................ 357/74, 75, 81; 361/386, 388, 398, 400, 401, 403, 409, 410, 405, 412–414, 306, 308, 309, 321, 321 C; 439/67, 68, 69, 70, 71, 74, 77, 493

[56] References Cited

U.S. PATENT DOCUMENTS

| | | | |
|---|---|---|---|
| 3,049,647 | 8/1962 | Lincoln | 317/101 |
| 3,191,098 | 6/1965 | Fuller | 317/101 |
| 3,290,756 | 12/1966 | Dreyer | 29/155.5 |
| 3,356,786 | 12/1967 | Helms | 174/68.5 |
| 3,530,411 | 9/1970 | Sear | 333/96 |
| 3,614,832 | 10/1971 | Chance et al. | 29/626 |
| 3,774,400 | 11/1973 | Tabuch | 357/80 |
| 3,983,458 | 9/1976 | Jordan et al. | 317/101 |
| 4,153,988 | 5/1979 | Doo | 29/626 |
| 4,210,950 | 7/1980 | Fraser, Jr. et al. | 361/329 |
| 4,222,090 | 9/1980 | Jaffe | 361/386 |
| 4,225,900 | 9/1980 | Ciccio | 361/395 |
| 4,231,154 | 11/1980 | Gazdik et al. | 29/840 |
| 4,237,522 | 12/1980 | Thompson | 361/392 |
| 4,249,196 | 2/1981 | Durney et al. | 357/74 |
| 4,251,852 | 2/1981 | Ecker et al. | 361/386 |
| 4,274,124 | 6/1981 | Feinberg et al. | 361/275 |
| 4,328,530 | 5/1982 | Bajorek et al. | 361/308 |
| 4,328,531 | 5/1982 | Nagashima et al. | 361/401 |
| 4,349,862 | 9/1982 | Bajorek et al. | 361/401 |
| 4,377,316 | 3/1983 | Ecker et al. | 339/17 |
| 4,378,537 | 3/1983 | Scandura | 333/100 |
| 4,420,652 | 12/1983 | Ikeno | 174/52 |
| 4,430,690 | 2/1984 | Chance et al. | 361/321 |
| 4,453,176 | 6/1984 | Chance et al. | 357/51 |
| 4,454,529 | 6/1984 | Philofsky | 357/51 |
| 4,480,288 | 10/1984 | Gazdik et al. | 361/398 |
| 4,494,172 | 1/1985 | Leary et al. | 361/400 |
| 4,546,028 | 10/1985 | Val | 361/386 |
| 4,549,200 | 10/1985 | Ecker et al. | 357/80 |
| 4,626,805 | 12/1986 | Jones | 333/33 |
| 4,636,918 | 1/1987 | Jodoin | 361/321 |
| 4,654,694 | 3/1987 | Val | 361/321 |
| 4,658,330 | 4/1987 | Berg | 361/386 |

OTHER PUBLICATIONS

U.S. patent application SN-913,435, entitled "Electronic Package with Distributed Decoupling Capacitors", filed 9/30/86, in name of Michael B. Brown et al.
C. M. Val & H. G. Bricaud, "A Breakthrough in Advanced Very High-Speed Integrated (VHSIC) Packaging—Advantages of the Leadless Chip Carrier over Pin Grid Arrays (PGA)", 1985 ISHM Proceedings, Nov. 11–14, 1985, Anaheim, CA, pp. 334–342.

(List continued on next page.)

*Primary Examiner*—G. P. Tolin
*Attorney, Agent, or Firm*—David L. Adour; H. Saint Julian

[57] ABSTRACT

An electronic packaging structure includes a second level electronic package having at least one opening formed therein and circuitry for electrical connection to a semiconductor chip. A circuitized polyimide film chip carrier includes at least one semiconductor chip mounted on one major surface thereof and at least one decoupling capacitor mounted on an opposite surface thereof. The decoupling capacitor is electrically coupled to input/output contacts of the semiconductor chip. The carrier is then mounted on the second level electronic package so that one semiconductor chip is positioned within a respective opening and the circuitry formed on the carrier is coupled to the circuitry formed on the second level package thereby interconnecting the semiconductor chip to the electronic package.

15 Claims, 2 Drawing Sheets

OTHER PUBLICATIONS

R. O. Lussow, "Internal Capacitors and Resistors for Multilayer Ceramic Modules", *IBM TDB,* vol. 20, No. 9, Feb. 1972, pp. 1977–1980, (IBM Corp., Armonk, NY 10504).

C. M. McIntosh & A. F. Schmeckenbecker, "Packaging of Integrated Circuits", *IBM TDB,* vol. 15, No. 6, Nov. 1972, pp. 1977–1980, (IBM Corp., Armonk, NY 10504).

B. Narken & R. R. Tummala, "Low Capacitive Via Path Through High Dielectric Constand Material", *IBM TDB,* vol. 22, No. 12, May 1980, pp. 5330–5331, IBM Corp. Armonk, NY 10504).

L. T. Olson & R. R. Sloma, "Chip Carrier Enhancements for Improving Electrical Performance", 35th Electronic Components Conference Proceedings, May 20, 22, 1985, Wash., D.C., pp. 372–378.

Toshihiko Watari & Hiroshi Murano, "Packaging Technology for the NEC SX Supercomputer", 35th Electronic Components Conference Proceedings, May 20, 22, 1985 Wash., D.C., pp. 192–198.

L. T. Olson & R. R. Sloma, "Three Dimensional Modeling for Complex Integrated Circuit Packages", 36th Electronic Components Conference Proceedings, May 5–7, 1986, Seattle, Wash., pp. 187–202.

T. R. Homa, "Reliability of Metallized Ceramic/Polyimide Substrates", 36th Electronic Components Conference Proceedings, May 5–7, 1986, Seattle, Wash., pp. 609–615.

FLEXIBLE FILM CHIP CARRIER WITH DECOUPLING CAPACITORS

This application is a continuation of application Ser. No. 931,813 filed Nov. 18, 1986, now abandoned.

BACKGROUND OF THE INVENTION

1. Field of the Invention

This invention relates to integrated circuit semiconductor chip packages and more particularly to semiconductor chip carrier, first level electronic packages having high frequency decoupling capacitors as a part of the package.

2. Background Information

As very large scale integrated (LSI) circuits tend to get more complex, there is a need to switch more output driver circuits at a faster rate in order to increase the performance thereof. Moreover, an increase in the use of parallel processing techniques have necessitated designing semiconductor chip carriers for optimum performance of the LSI circuits. Similarly, these techniques require a high number of driver circuits to switch simultaneously at fast transition speeds and high currents. The effective inductance of semiconductor chip and package power paths for these active switching circuits relates directly to the amount of power distribution noise. Power paths which feed the driver circuits are particularly noise sensitive to the inherent effective inductance for simultaneous switching activity. Various techniques have been utilized in the art to minimize the level of switching noise associated with the increase and the magnitude of the switching rate.

One known technique for reducing the level of noise is to incorporate discrete capacitors as a decoupling capacitor between associated voltage pins. Generally, the discrete capacitors, which are mounted on a top surface of a carrier and distance away from the semiconductor chip, is electrically coupled thereto by a plurality of power wiring lines or a large power buses. This technique of positioning the discrete capacitors on the top surface of a carrier reduces the wireability on the top surface. Moreover, the power wiring lines typically represent long inductances paths which, in response to the increase in current flowing therein, facilitate the development of voltage drops thereacross. The voltage drops are viewed as unwanted power distribution noise. One technique of minimizing the inductances paths is move the discrete capacitors as close to the semiconductor chip as possible. However, in view of either the layout of the wiring lines on the top surface associated with the semiconductor chip or the physical dimensions of the discrete capacitor, this technique does not result in a substantial reduction in the inductance paths and the noise associated therewith.

Consequentially, there is a need for a technique which reduces the noise associated with the increase in the rate which the current switches, minimizes the inductances paths and maximizes the wireability of the top surface of the carrier associated with the semiconductor chip.

OBJECTS OF THE INVENTION

Therefore it is an object of the invention to provide an improved electronic package for semiconductor chips.

It is another object of the invention to provide a technique for connecting decoupling capacitors directly to the semiconductor chips input/output lines.

It is still another object of the invention to increase the wireability of a carrier associated with the semiconductor chip.

SUMMARY OF THE INVENTION

In accordance with these objects, features and advantages of the invention are accomplished by an electronic packaging structure described herein. The electronic packaging structure includes a second level electronic package having at least one opening therein for accommodating a semiconductor chip and circuitry for electrical connection to the semiconductor chip. A thin film structure having circuitry formed thereon includes a semiconductor chip mounted on one side thereof and at least one decoupling capacitor mounted on an opposite side of the thin film structure. The decoupling capacitor is electrically connected to input/output contacts of the semiconductor chip. The thin film structure is then mounted on the second level electronic package so that the semiconductor chip is positioned within the opening of the second level electronic package. Additionally, the circuitry formed on the thin film structure is coupled to the circuitry on the second level electronic package which in order to interconnect the input/output contacts of the semiconductor chip to the second level electronic package.

BRIEF DESCRIPTION OF THE DRAWINGS

The foregoing and other advantages of the invention will be more fully understood with reference to the description of the best mode and the drawings wherein.

DESCRIPTION OF THE BEST MODE FOR CARRYING OUT THE INVENTION

Figure 1:
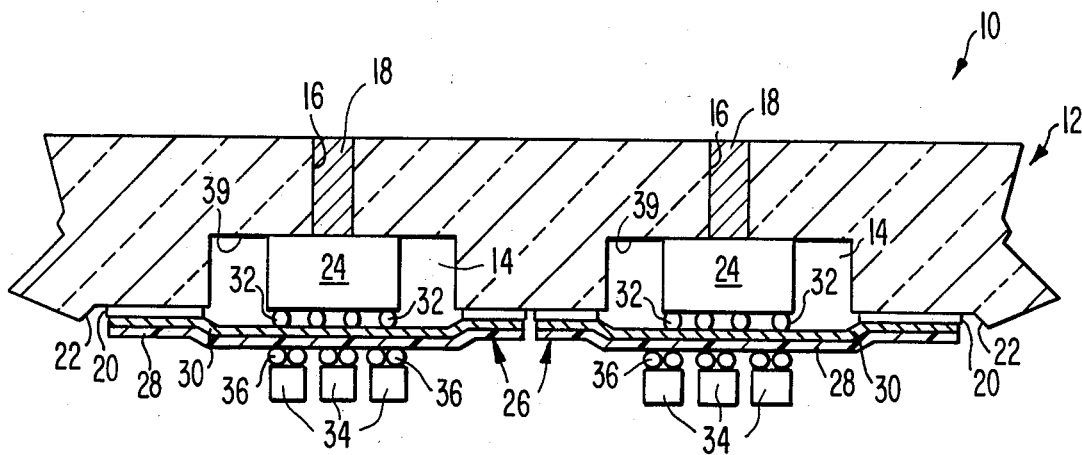
FIG. 1 shows a side view of an electronic package in accordance with the principles of this invention.

Referring to FIG. 1, there is shown a side view of an electronic package 10. The package 10 includes a second level electronic package such as a ceramic card 12 having a plurality of cavities 14 formed therein. It should be understood that the second level electronic package 12 need not be ceramic material, which has a dielectric constant of approximately 9.5; any relatively non-resilient material having a low dielectric constant—preferably less than 4—could be used. The plurality of apertures 16 are formed through the ceramic card 12 so that a selected one of the apertures communicates with a selected one of the cavities 14. A metal stub 18, which is positioned within each one of the plurality of apertures 16, facilitates the conductance of heat away from the respective one of the cavities 14. A plurality of wiring lines 20, formed on a first surface 22 of the ceramic card 12, serve as signal and power lines.

Figure 2:
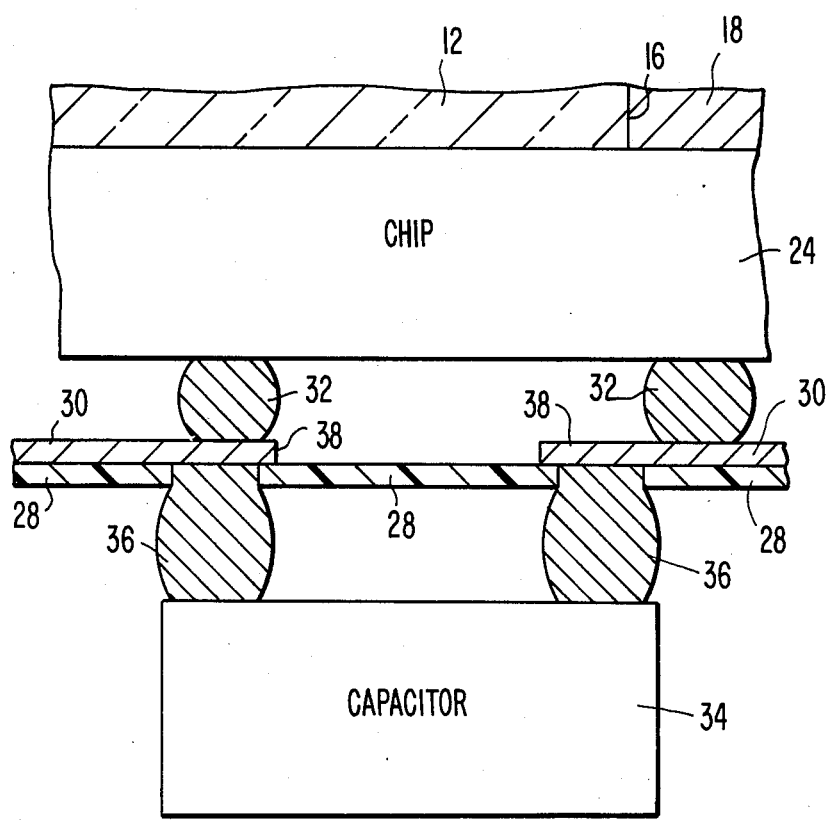
FIG. 2 shows a exploded sectional view of a semiconductor chip mounted on a flexible carrier having a discrete capacitor coupled thereto in accordance with the principles of this invention.

FIG. 2 shows an exploded sectional view of the electronic package 10. Referring to FIGS. 1 and 2, at least one semiconductor chip 24 is mounted on a first major surface of a thin-film structure such as a flexible film carrier film 26. The flexible film carrier 26 includes a layer of polyimide film 28 and a layer of metal 30 formed on a first major surface of the polyimide layer. The layer of metal 30 is processed to form a plurality of signal and power lines. Input/output contacts associated with the semiconductor chip 24 are coupled to selected ones of the signal and power lines by a plurality of solder bonds 32. A plurality of discrete capacitors 34 are mounted on a second major surface of the flexible film carrier 26. The capacitors 34 are coupled to selected ones of the input/out contacts of the semiconductor chip 24 by a plurality of solder bonds 36 and vias 38 formed in the polyimide film 28. Moreover, the discrete capacitors are mounted such that a first terminal of a selected one of the capacitors is connected to a first potential and a second terminal of the capacitor is connected to a second potential.

The flexible film carrier 26 is then mounted on the ceramic card 12 so that (1) the signal and power lines formed on the flexible carrier are coupled to the wiring lines 20 formed on the ceramic card in order to interconnect the input/output contacts to the ceramic card and (2) the semiconductor chip 24 is positioned within a selected one of the cavities 14 and communicates with the stub 18. The semiconductor chip 24 may be adhesively secured to an upper wall 39 of the selected one of the cavities 14. Moreover, a heat sink (not shown) may be coupled to the metal stubs 18 to facilitate the conductions of heat from the respective semiconductive chip 24.

Figure 3:
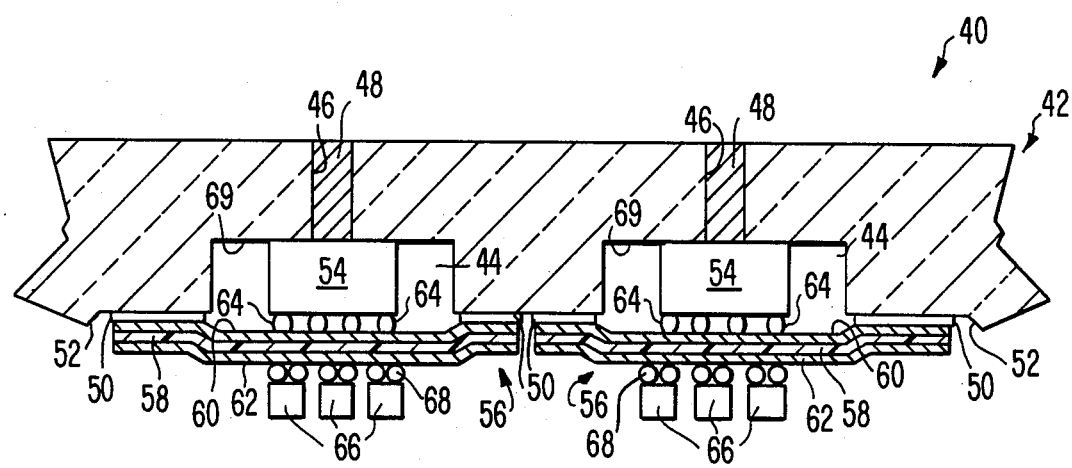
FIG. 3 shows an alternate embodiment of the electronic package of FIG. 1 in accordance with the principles of this invention.

Referring to FIG. 3, there is shown a side view of an alternate embodiment of an electronic package 40. The package 40 includes a second level electronic package such as a ceramic card 42 having a plurality of cavities 44 formed therein. A plurality of apertures 46 are formed through the ceramic card 42 so that a selected one of the apertures communicates with a selected one of the cavities 44. A metal stub 48, which is positioned within each one of the plurality of apertures 46, facilitates the conduction of heat away from the respective one of the cavities 44. A plurality of wiring lines 50, formed on a first surface 52 of the ceramic card 42, serve as signal and power lines.

At least one semiconductor chip 54 is mounted on a first surface of a thin-film structure such as a flexible film carrier 56. The flexible film carrier 56 includes a layer of polyimide film 58, a first layer of metal 60 formed on a first major surface of the polyimide layer and a second layer of metal 62 formed on a second major surface of the polyimide layer. The first layer of metal 60 is processed to form a plurality of signal lines. The second layer of metal 62 is processed to form a power/ground plane which also serves as a reference plane for the signal lines formed in the first layer of metal 60. Input/output contacts associated with the semiconductor chip 54 are coupled to selected ones of the signal lines by a plurality of solder bonds 64. The plurality of discrete capacitors 66 are mounted on and electrically coupled to the second layer of metal 62 by a plurality of solder bonds 68 so that a first terminal of a selected capacitor is coupled to a first potential while a second terminal of the capacitor is connected to a second potential. Additionally, the discrete capacitors 66 are coupled to selected ones of the input/output contacts of the semiconductor chip 64 through vias formed in the polyimide layer 58 and the first layer of metal 60. The input/output contacts are also coupled to the power/ground plane in a similar manner to provide power and ground signals to the semiconductor chip 54.

The flexible film carrier 56 is then mounted on the ceramic card 42 so that (1) the signal lines formed in the first layer of metal 60 of the flexible carrier are coupled to the wiring lines 50 formed on the ceramic card in order to interconnect the input/output contacts to the ceramic card and (2) one semiconductor chip 54 is positioned within a selected one of the cavities 44 and communicates with the selected one of the stubs 48. The semiconductor chip 54 may be adhesively secured to an upper wall 69 of the selected one of the cavities 44. Additionally, a heat sink (not shown) may be coupled to the metal stubs 48 to facilitate the conductance of heat away from the respective semiconductor chip 54.

In summary, the flexible film carriers 26 and 56 include at least one semiconductor chip 24 and 54, respectively, mounted on one side thereof and decoupling capacitors 34 and 66 mounted on an opposite side thereof, respectively. The flexible carriers 26 and 56 are then mounted on respective ceramic cards 12 and 42 so that (1) one semiconductor chip 24 and 54 is positioned with each of the plurality of cavities 14 and 44, respectively and (2) signal and power lines formed on the flexible carrier are coupled to wiring lines 20 and 50, respectively, formed on the ceramic card 12 and 14. Mounting the decoupling capacitors 34 and 66 in this manner places the capacitors extremely close to input/output contacts associated with the respective semiconductor chip 24 and 56 which minimizes the inductance paths and reduces electrical switching noise caused by a plurality of off-chip drivers (OCDs). Moreover, this reduction in the electrical switching noise facilitates an increase in the number of OCDs which may be switched simultaneously at relatively fast transition rates and high currents.

While the invention has been particularly shown and described with reference to a preferred embodiment thereof, it will be understood by those skilled in the art that various changes in detail may be made therein without departing from the spirit, scope and teachings of the invention. Accordingly, the electronic package therein disclosed is to be considered merely as illustrative, and the invention is to be limited only as specified in the claims.

What is claimed:

1. An electronic packaging structure comprising:
a second level electronic package having one opening therein for accommodating a semiconductor chip and having circuitry for electrical connection to the semiconductor chip; and
a circuitized thin film structure having a semiconductor chip mounted on one side of the thin-film structure and at least one decoupling capacitor mounted on an opposite side of the thin-film structure which is electrically connected to input/output contacts of said semiconductor chip, said thin-film structure is mounted on the second level electronic package with the semiconductor chip positioned in the opening of the second level package and with the circuitry on said thin-film structure connected to the circuitry on the second level electronic package to electrically interconnect the input/output contacts of said semiconductor chip to the circuitry on the second level electronic package.

2. The electronic packaging structure as recited in claim 1 wherein the thin-film structure is a polyimide film chip carrier.

3. The electronic packaging structure as recited in claim 2 further includes means for cooling this semiconductor chip.

4. The electronic packaging structure as recited in claim 3 wherein the cooling means includes:
   an aperture formed through the second level electronic package which communicates with the opening of the package; and
   a metal stub inserted the aperture and communicates with the semiconductor chip for transferring heat away from the semiconductor chip.

5. The electronic packaging structure as recited in claim 4 wherein the second level electronic package is a ceramic card.

6. An electronic packaging structure comprising:
   a second level electronic package having at least one opening formed therein for accommodating a semiconductor chip and having circuitry for electrical connection to the semiconductor chip;
   a flexible film carrier having a plurality of signal lines formed on a first surface of a layer of polyimide film and a power/ground plane formed on a second surface of the layer of polyimide film;
   at least one semiconductor chip having a plurality of input/output contacts selectively coupled to the signal lines and the power/ground plane of the flexible film carrier; and
   at least one decoupling capacitor mounted on the power/ground plane and electrically coupled to selected input/output contacts of the semiconductor chip;
   whereby the flexible film carrier having the semiconductor chip and the decoupling capacitor mounted thereon is on the second level electronic package so that one semiconductor chip is positioned within one opening and the signal lines on the carrier are coupled to the circuitry on the second level electronic package to interconnect the input/output contacts of the semiconductor chip to the circuitry on the second level electronic package.

7. The electronic packaging structure as recited in claim 6 further includes means for cooling the semiconductor chip.

8. The electronic packaging structure as recited in claim 7 wherein the cooling means includes:
   an aperture formed through the second level electronic package and communicates with the opening formed in the electronic package; and
   a metal stub inserted the aperture which communicates with the semiconductor chip for transferring heat away from the semiconductor chip.

9. The electronic packaging structure as recited in claim 8 wherein the second level electronic package is a ceramic card.

10. An electronic packaging structure comprising:
    a second level electronic package having a plurality of openings formed therein for accommodating a plurality of semiconductor chips and having circuitry for electrical connection to the semiconductor chips; and
    a circuitized polyimide film chip carrier having the semiconductor chips mounted on one side of the carrier and at least one decoupling capacitor mounted on an opposite side of the carrier which is electrically connected to input/output contacts of the semiconductor chips, the carrier is mounted on the second level electronic package so that one of the semiconductor chips is positioned in each of the openings of the second level package and with the circuitry on said carrier connected to the circuitry on the second level electronic package to electrically interconnect the input/output contacts of said semiconductor chips to the circuitry on the second level electronic package.

11. The electronic packaging structure as recited in claim 10 further includes means for cooling this semiconductor chip.

12. The electronic packaging structure as recited in claim 11 wherein the cooling means includes:
    an aperture formed through the second level electronic package and communicates with the opening of the package; and
    a metal stub inserted in the aperture to communicate with the semiconductor chip for transferring heat from the semiconductor chip.

13. The electronic packaging structure as recited in claim 12 wherein the second level electronic package is a ceramic card.

14. The electronic packaging structure as recited in claim 2 wherein said polyimide film chip carrier comprises a low dielectric constant.

15. The electronic packaging structure as recited in claim 11 wherein said circuitized polyimide film chip carrier comprises material having a low dielectric constant.

* * * * *